United States Patent
Källmark et al.

(10) Patent No.: US 9,258,927 B2
(45) Date of Patent: Feb. 9, 2016

(54) HEAT TRANSFER ARRANGEMENT AND ELECTRONIC HOUSING COMPRISING A HEAT TRANSFER ARRANGEMENT

(75) Inventors: Magnus Källmark, Stockholm (SE); Klas Hedberg, Huddinge (SE); Fredrik Jonsson, Bro (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 830 days.

(21) Appl. No.: 13/395,896

(22) PCT Filed: Sep. 15, 2009

(86) PCT No.: PCT/SE2009/051020
§ 371 (c)(1), (2), (4) Date: Mar. 14, 2012

(87) PCT Pub. No.: WO2011/034472
PCT Pub. Date: Mar. 24, 2011

(65) Prior Publication Data
US 2012/0186291 A1    Jul. 26, 2012

(51) Int. Cl.
*F25D 23/12* (2006.01)
*F25D 15/00* (2006.01)
(Continued)

(52) U.S. Cl.
CPC ........ *H05K 7/20327* (2013.01); *F28D 15/0266* (2013.01); *F28D 15/06* (2013.01); *G05D 23/125* (2013.01); *H01L 23/427* (2013.01); *H01L 2924/0002* (2013.01)

(58) Field of Classification Search
CPC ... F28D 15/0266; F28D 15/06; H01L 23/427; H01L 33/648; H05K 7/20327; H05K 7/2029; H05K 7/20381; H05K 7/20336; H05K 7/20663; H05K 7/207; H05K 7/208; H05K 7/20836; G05D 23/125; G05D 23/123
USPC ........................ 62/259.2, 119, 515, 527, 528; 165/104.33; 361/676–677, 679.52, 700
See application file for complete search history.

(56) References Cited

U.S. PATENT DOCUMENTS 3,112,890 A    12/1963    Snelling
4,393,663 A *  7/1983    Grunes et al. ................... 62/119
(Continued)

FOREIGN PATENT DOCUMENTS

CN    1506648 A    6/2004
DE    4108981 A1    10/1992
(Continued)

*Primary Examiner* — Frantz Jules
*Assistant Examiner* — Joseph Trpisovsky
(74) *Attorney, Agent, or Firm* — Murphy, Bilak & Homiller, PLLC

(57) ABSTRACT

A heat transfer arrangement for heat exchange between an inside of an electronic component housing and an ambient environment. The heat transfer arrangement comprises a refrigerant circuit with an evaporator a condenser and conduits (202). A refrigerant is arranged to self-circulate in a refrigerant flow in the refrigerant circuit. A flow control device (124) comprises a movable member (206) adapted to control the refrigerant flow. The movable member (206) affects a through flow area of one of the conduits (202). The movable member (206) is adapted to move in response to a pressure change inside the refrigerant circuit by being affected from a first side by a refrigerant pressure inside the refrigerant circuit and from a second side by a spring force such that the refrigerant flow is changed.

13 Claims, 2 Drawing Sheets

(51) Int. Cl.
*F25B 41/06* (2006.01)
*H05K 7/20* (2006.01)
*F28D 15/02* (2006.01)
*F28D 15/06* (2006.01)
*H01L 23/427* (2006.01)
*G05D 23/12* (2006.01)

(56) References Cited

U.S. PATENT DOCUMENTS

| | | |
|---|---|---|
| 5,203,399 A | 4/1993 | Koizumi |
| 6,672,373 B2 * | 1/2004 | Smyrnov ................ 165/104.26 |
| 2001/0000201 A1 * | 4/2001 | Osakabe et al. ......... 165/104.33 |
| 2003/0205364 A1 | 11/2003 | Sauciuc et al. |
| 2006/0065386 A1 * | 3/2006 | Alam ...................... 165/104.33 |

FOREIGN PATENT DOCUMENTS

| | | |
|---|---|---|
| EP | 0249467 A1 | 12/1987 |
| WO | 0039508 A1 | 7/2000 |
| WO | 03065781 A1 | 8/2003 |

* cited by examiner

HEAT TRANSFER ARRANGEMENT AND ELECTRONIC HOUSING COMPRISING A HEAT TRANSFER ARRANGEMENT

TECHNICAL FIELD

The present invention relates to a heat transfer arrangement comprising a refrigerant circuit according to the precharacterizing portion of claim 1. The invention also relates to an electronic component housing comprising such a heat transfer arrangement.

BACKGROUND

Heat transfer systems utilizing a refrigerant circulating through an evaporator and a condenser are well known. A heat transfer system wherein the refrigerant self-circulates, i.e. gravity and buoyancy are forces driving the circulation of the refrigerant, is sometimes referred to as a thermosiphon.

Many electronic component housings need to be cooled due to the heat generated by the electronic components inside the housing. WO99/60709 discloses a method and an apparatus for cooling electronic components of radio base stations installed at elevated locations. An evaporator of a thermosiphon cooling system is in thermal contact with heat-generating electronic components to be cooled. A condenser of the thermosiphon cooling system is arranged above the evaporator. The condenser is constructed and arranged for natural convection of ambient air.

Generally, a modern radio communication system comprises a radio access network and a number of communication devices. The radio access network is built up of several nodes, in particular, radio base stations. The primary task of a radio base station is to send and receive information to/from the communication devices within a cell served by the radio base station. In many cases, the base station is run 24 hours a day. Therefore, it is of particular interest and importance to ensure that the base station is operable predictably and reliably. The radio base station comprises an electronic component housing. Inside the electronic component housing there are arranged electronic components and circuitry for performing different tasks of the radio base station. For example, the circuitry may comprise a power control unit, a radio unit comprising a radio amplifier, and a filtering unit for performing corresponding tasks.

Heat generated in the circuitry of the base station, in particular the radio unit, may not always dissipate naturally to a sufficiently high degree. Instead, heat is accumulated in the circuitry and the temperature of the circuitry increases. The increased temperature of the circuitry may impair the performance of circuitry within the radio base station. Consequently, unpredicted interruptions in operation of the base station may occur.

This is clearly not desired and a thermosiphon cooling system as disclosed in WO99/60709, mentioned above, could be used to cool the electronic component housing. WO99/60709 does however not disclose how cooling may be controlled in a thermosiphon cooling system. Under certain conditions it is namely desirable to not cool the electronic component housing in order to avoid a too low temperature inside the electronic component housing, which also could harm the electronic components and circuitry inside the electronic component housing.

SUMMARY

An object of the present invention is to provide a heat transfer arrangement with improved temperature regulation of an inside of an electronic component housing.

According to an aspect of the invention, this object is achieved by a heat transfer arrangement for heat exchange between an inside of an electronic component housing and an ambient environment. The heat transfer arrangement comprises a refrigerant circuit, which refrigerant circuit comprises an evaporator adapted to be arranged inside the electronic component housing, a condenser adapted to be arranged outside said electronic component housing, and conduits connecting the evaporator and the condenser. A refrigerant is present in the refrigerant circuit and in use is arranged to self-circulate in a refrigerant flow in the refrigerant circuit by evaporating in the evaporator, rising as a gas through a first conduit of the said conduits, condensing in the condenser and flowing through a second conduit of the said conduits to the evaporator. The heat transfer arrangement further comprises a flow control device comprising a movable member adapted to control the refrigerant flow. The movable member affects a through flow area of one of the conduits. The movable member is adapted to move in response to a pressure change inside the refrigerant circuit by being affected from a first side by a refrigerant pressure inside the refrigerant circuit and from a second side by a spring force such that the refrigerant flow is changed.

Since the movable member affects a through flow area of one of the conduits in response to the pressure inside the refrigerant circuit as it balances against a spring force, refrigerant flow is effectively controlled. As the temperature inside the electronic component housing drops, the temperature and the pressure inside the refrigerant circuit also drop and at a certain temperature the through flow area of the conduit is essentially closed and heat exchange between the inside of the electronic component housing and the ambient environment is stopped or essentially stopped. As a result, the above mentioned object is achieved. There may be no need of any electronic control device to control the refrigerant flow, which may reduce energy consumption and improve reliability of the heat transfer arrangement.

The spring force may be generated by a gas spring, a coil spring, a cup spring or other kinds of springs. Conduits where the movable member affects the through flow area may include passages inside the condenser and the evaporator.

According to example embodiments, the movable member may be arranged in or on one of the conduits. The movable member may be arranged in or on the first conduit. Alternatively, the movable member may be arranged in or on the second conduit. Thus, the movable member and the flow control device may be one unit, which may be attached to one of the conduits.

According to example embodiments the spring force may be generated by a gas enclosed in a chamber.

According to example embodiments the movable member may comprise a piston sliding in a piston housing.

According to example embodiments the chamber may be formed by the piston and the piston housing.

According to example embodiments the movable member may comprise a resilient wall portion of the conduits.

According to example embodiments the resilient wall portion may form a wall of the chamber.

According to example embodiments the chamber may be in thermal communication with an inside of the electronic component housing. This may be achieved by arranging the flow control device inside the electric component housing or by arranging the flow control device in physical contact with the electronic component housing.

According to example embodiments the gas may be enclosed in an elastic container. This may improve leakage properties of the chamber by providing a further container inside the chamber to hold the gas.

According to an aspect of the invention an electronic component housing comprises a heat transfer arrangement according to example embodiments.

According to example embodiments the electronic component housing may further comprises a first gas moving device for circulating a gas such as air inside the electronic component housing over an outer surface area of the evaporator. In this manner heat transfer between the air and the evaporator may be improved providing cool air for cooling electronic components inside the electronic component housing.

According to example embodiments the electronic component housing may comprise a second gas moving device for blowing ambient air over an outer surface area of the condenser. In this manner heat transfer between ambient air and the condenser may be improved.

According to example embodiments the electronic component housing may be part of a radio base station.

Further features of, and advantages with, the present invention will become apparent when studying the appended claims and the following description. Those skilled in the art will realize that different features of the present invention may be combined to create embodiments other than those described in the following, without departing from the scope of the present invention, as defined by the appended claims.

BRIEF DESCRIPTION OF THE DRAWINGS

The various aspects of the invention, including its particular features and advantages, will be readily understood from the following detailed description and the accompanying drawings, in which.

DETAILED DESCRIPTION

The present invention will now be described more fully with reference to the accompanying drawings, in which example embodiments are shown. However, this invention should not be construed as limited to the embodiments set forth herein. Disclosed features of example embodiments may be combined as readily understood by one of ordinary skill in the art to which this invention belongs. Like numbers refer to like elements throughout.

Well-known functions or constructions may not be described in detail for brevity and/or clarity.

Figure 1:
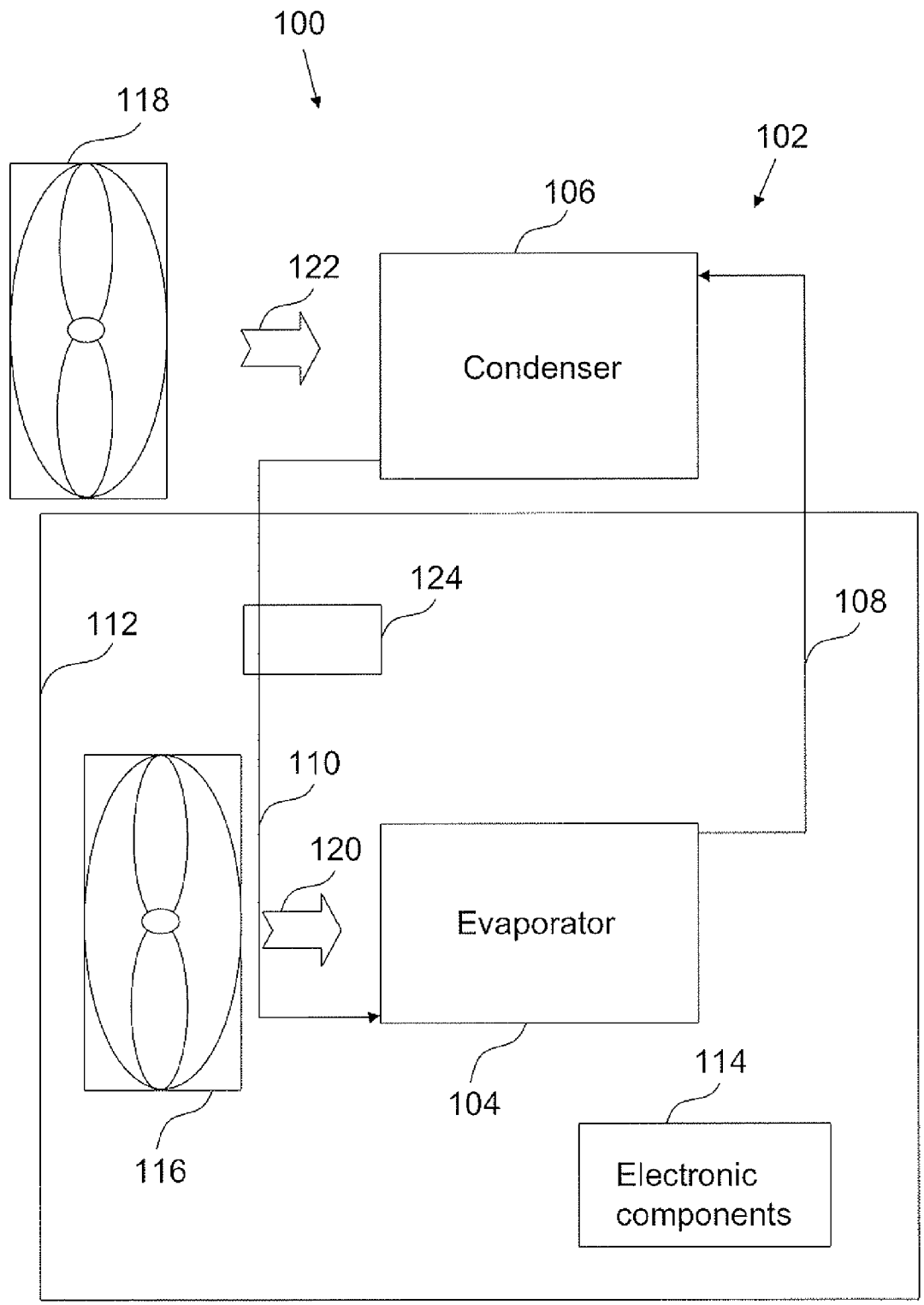
FIG. 1 illustrates schematically a heat transfer arrangement according to example embodiments.

FIG. 1 illustrates schematically a heat transfer arrangement 100 according to example embodiments. A refrigerant circuit 102 comprises an evaporator 104, a condenser 106 and conduits. The conduits include a first conduit 108 and a second conduit 110. Inside the refrigerant circuit 102 there is a refrigerant, e.g. R134a which is a name for 1,1,1,2-Tetrafluoroethane, which has the chemical formula $CH_2FCF_3$. Under certain conditions the refrigerant self-circulates in the refrigerant circuit 102. The refrigerant in liquid form evaporates inside the evaporator 104 and rises in gas form through the first conduit 108 to the condenser 106. Inside the condenser 106 the refrigerant in gas form condenses and flows in liquid form back to the evaporator 104 through the second conduit 110.

Gravity and buoyancy are forces driving the self-circulation. When the condenser 106 is arranged above the evaporator 104, as schematically shown, an efficient self-circulation of refrigerant takes place. Liquid refrigerant will not be collected to any substantial extent in the condenser 106 but will flow through the second conduit 110 down to the evaporator 104. Also in a refrigerant circuit with the evaporator and the condenser arranged laterally beside each other and with the first conduit arranged such that refrigerant in gas form can rise therein, a refrigerant may self-circulate. However, in this case liquid refrigerant would occupy part of the condenser, the condenser and evaporator being communicating vessels.

An electronic component housing 112 is adapted to house electronic components 114. In example embodiments the electronic component housing 112 may be a radio base station and the electronic components 114 may be part of devices associated with such a radio base station, e.g. a radio unit. The heat transfer arrangement 100 is provided for heat exchange between an inside of the electronic component housing 112 and an ambient environment of the electronic component housing 112 and thus it is adapted to cool the electronic components 114. For this purpose the evaporator 104 of the refrigerant circuit 102 is arranged inside the electronic component housing 112. The condenser 106 is arranged outside the electronic component housing 112, where the refrigerant in gas form is cooled and condenses to flow back to the evaporator 104 through the second conduit 110.

Inside the electronic component housing 112 a first gas moving device, e.g. a first fan 116, is arranged and adapted to circulate a gas, commonly air, inside the electronic component housing 112. Outside the electronic component housing 112 a second gas moving device, e.g. a second fan 118, is arranged and adapted to blow ambient air over an outer surface area of the condenser 106. The condenser 106 and also the second fan 118 may be arranged in a non-shown separate housing. Suitably such a separate housing is in open communication with the ambient environment. To save vertical space inside the electronic component housing 112 the evaporator 104 may be arranged at an acute angle from a horizontal line, e.g. at 5-60 degrees. Also the condenser 106 may be arranged at an acute angle, at the same angle as the evaporator 104 or at a different angle.

In use, the electronic components 114 inside the electronic component housing 112 generate heat. Depending inter alia on generated heat, construction of the electronic component housing 112 and on ambient conditions such as temperature, air movement (e.g. wind) and precipitation (e.g. rain), the temperature inside the electronic component housing 112 may increase to a level which could harm the electronic components 114. The heat transfer arrangement 100 and primarily the evaporator 104 of the refrigerant circuit 102 is arranged to cool the air inside the electronic component housing 112 to avoid such harmful temperature levels. A suitable aim of example embodiments may be to keep the temperature inside the electronic component housing 112 below +60 degrees Celsius.

Under certain conditions the refrigerant self-circulates inside the refrigerant circuit 102 as explained above. By utilizing warm air inside the electronic component housing 112 for evaporating the refrigerant, the temperature of the air inside the electronic component housing 112 will fall and may be used for cooling the electronic components 114. Inter alia to ensure proper cooling of the electronic components 114, the first fan 116 may circulate the air inside the electronic component housing 112 past the evaporator 104 and the electronic components 114, as indicated by arrow 120. Circulation in another direction than indicated by arrow 120 is also possible. In the condenser 106 the refrigerant in gas form will condense to liquid form by emitting heat to the ambient environment. Transfer of heat from the condenser 106 to the ambient environment may be increased by switching on the second fan 118 to blow ambient air over an outer surface area of the condenser 106, e.g. in the direction indicated by arrow 122. The rotational speeds of the first and second fans 116, 118 may be controlled to control the heat exchange between the inside of the electronic component housing 112 and the ambient environment.

Example embodiments may omit the first fan and/or the second fan. Circulation of the gas inside the electronic component housing 112 due to temperature differences may be utilized to circulate the gas over the outer surface of the evaporator 104. Similarly, ambient air may flow over the outer surface of the condenser 106 due to natural air movement, e.g. due to wind. It is further envisaged that the electronic components 114 inside the electronic component housing 112 may be in contact with the evaporator 104 such that heat is conducted from the electronic components 114 to the evaporator 104, either directly our indirectly via a heat conductor other than a gas.

It is also desirable to not allow the temperature inside the electronic component housing 112 to fall below a certain temperature. A too low temperature could namely impede the function of the electronic components 114. Under certain conditions it may thus be desired to stop or reduce heat exchange by means of the heat transfer arrangement 100, between the inside of the electronic component housing 112 and the ambient environment. A suitable aim may be to keep the temperature inside the electronic component housing 112 above +5 degrees Celsius.

To control the heat exchange of the heat transfer arrangement 100 there is arranged a flow control device 124 in or on one or more of the conduits of the heat transfer arrangement 100. In FIG. 1 the flow control device 124 is arranged on the second conduit 110. Alternatively, the flow control device 124 may be arranged on the first conduit 108. The flow control device 124 comprises a movable member, which is arranged to control flow of the refrigerant in the refrigerant circuit 102, either flow of refrigerant in liquid form when arranged in or on the second conduit 110 or refrigerant in gas form when arranged in or on the first conduit 108.

The movable member of the flow control device 124 closes and opens the refrigerant circuit 102, i.e. it moves between a closed state and an open state. When the movable member is in the closed state it is at a first end position in one direction of motion of the movable member. There are two alternative situations when the movable member is in the closed state, either circulation of refrigerant is stopped, or circulation of refrigerant is limited in the refrigerant circuit 102. Accordingly, either no heat transfer takes place or limited heat transfer takes place. When the movable member is in the open state, a restricted flow or unrestricted flow of refrigerant in the refrigerant circuit 102 is allowed and heat from within the electronic equipment housing 112 is transferred to the ambient environment of the housing 112. It is to be noted that the open state includes intermediate positions of the movable member as well as a second end position of the movable member. In case of a restricted refrigerant flow, the flow of refrigerant in the refrigerant circuit 102 is reduced. Thus, is the heat exchange also reduced compared to if an unrestricted flow of refrigerant were allowed at a certain temperature.

The movable member of the flow control device 124 is adapted to move into the closed state or into the open state depending on a prevailing pressure inside the refrigerant circuit 102. This is achieved by the movable member being affected from a first side by the pressure of the refrigerant inside the refrigerant circuit 102 and from a second side by a spring force. The movable member will thus assume a position in which the force applied thereon by the pressure of the refrigerant in the refrigerant circuit is in equilibrium with the spring force.

Accordingly, when the refrigerant circuit 102 is subjected to a low temperature, the refrigerant pressure inside the refrigerant circuit 102 is low due to a prevailing low saturation pressure of the refrigerant. The movable member is thus moved by the spring force into or towards the closed state. Conversely, when the refrigerant circuit 102 is subjected to a high temperature, there is a high prevailing saturation pressure, which moves the movable member into the open state against the spring force.

Figure 2:
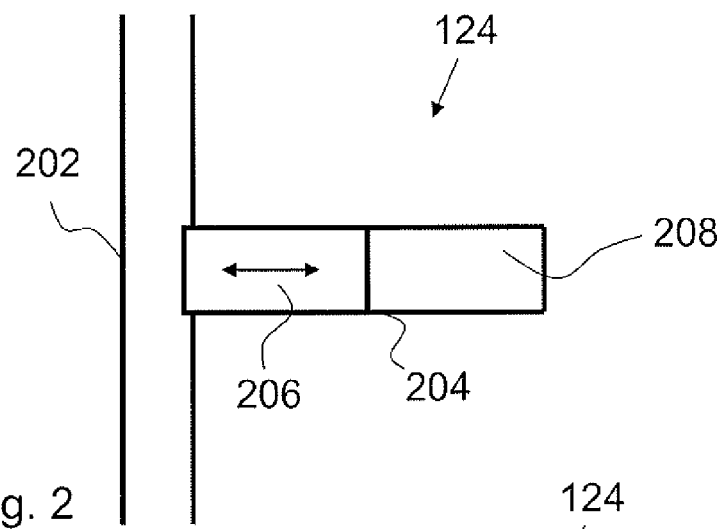
FIGS. 2-4 illustrate schematically sections of flow control devices of heat transfer arrangements according to example embodiments.

FIG. 2 illustrates schematically a section of a flow control device 124 of a heat transfer arrangement according to example embodiments. The flow control device 124 is arranged on a conduit 202 of the refrigerant circuit 102. The flow control device 124 comprises a piston housing 204 and a movable member in the form of a piston 206. A chamber 208 is formed between the piston 206 and the piston housing 204. The chamber 208 is sealed and filled with a gas, e.g. nitrogen. The gas inside the chamber 208 acts as a spring for the piston 206. When in equilibrium, a force applied on the piston 206 due to the pressure of the refrigerant inside the refrigerant circuit 102 and the spring force applied to the piston 206 due to the pressure of the gas inside the chamber 208, the piston 206 is stationary. When a pressure changes on one side of the piston 206, it is moved into a new equilibrium position.

The piston 206 is illustrated in an open state with a through flow area of the conduit 202 essentially unrestricted such that the refrigerant may self-circulate unimpededly inside the refrigerant circuit 102. This open state may suitably be reached when the temperature of the air inside the electronic component housing 112 is for instance above +5 degrees Celsius, above +20 degrees Celsius or above +50 degrees Celsius.

The pressure inside the refrigerant circuit 102 depends on the temperature, or mean temperature, inside the refrigerant circuit 102. There will always prevail saturation pressure inside the refrigerant circuit 102 because the refrigerant therein is always present in both gas form and liquid form. If the refrigerant inside the refrigerant circuit 102 is for example R134a, the saturation pressure and thus also the pressure inside the refrigerant circuit 102, will be 0.293 MPa at 0 degrees Celsius and 1.160 MPa at 45 degrees Celsius. If the piston 206 has the same area facing the chamber 208 as the refrigerant circuit 102, the pressure inside the chamber 208 will be the same as inside the refrigerant circuit 102 because the piston 206 transfers the pressure from the refrigerant circuit to the chamber 208.

For an ideal gas the following relationship is true:

$$\text{Pressure} \times \text{Specific Volume} = R \times \text{Temperature}$$

R is a constant, 297 Nm/kgKelvin for nitrogen (approximated to be equivalent to an ideal gas) and the temperature is given in Kelvin. Other relationships exist, e.g. the Van der Waal equation.

Following the above relationship:

The Specific Volume for nitrogen is 0.277 cubic meters per kilogram at 0 degrees Celsius (273 Kelvin) and 0.293 MPa (the above mentioned saturation pressure at 0 degrees Celsius), and the Specific Volume for nitrogen is 0.081 cubic meters per kilogram at 45 degrees Celsius and 1.160 MPa (the above mentioned saturation pressure at 45 degrees Celsius).

Since the relative saturation pressure change of the refrigerant is large in comparison to the temperature change, the gas (nitrogen) temperature has small effect on its specific volume.

This means that the volume of the chamber 208 decreases with increasing temperature and increasing pressure inside the refrigerant circuit 102. Accordingly, the piston 206 will be in the open state and the heat transfer arrangement 100 will cool the inside of the electronic component housing 112. Conversely, the volume of the chamber 208 will increase with decreasing temperature and decreasing pressure inside the refrigerant circuit 102. The piston 206 will eventually be in the closed state and the refrigerant is stopped, or essentially stopped, from circulating.

Figure 3:
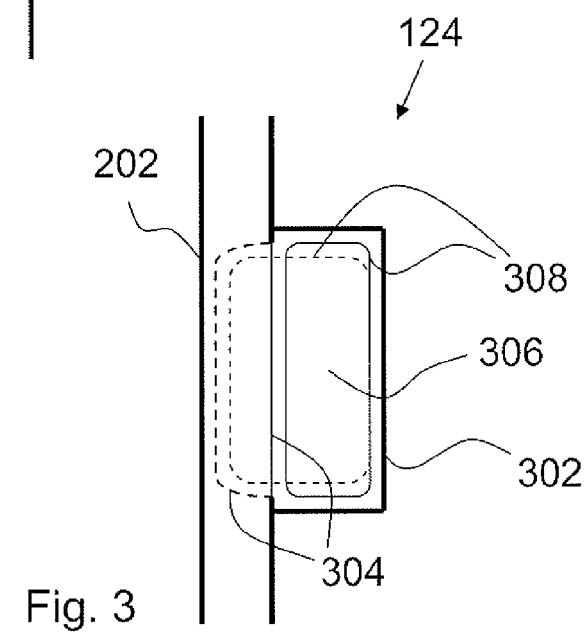

FIG. 3 illustrates schematically a section of a flow control device 124 of a heat transfer arrangement according to example embodiments. The flow control device 124 is arranged on a conduit 202 of the refrigerant circuit 102. The flow control device 124 comprises a housing 302 and a movable member in the form of a resilient wall portion 304 of the conduit 202, e.g. in the form of a rubber membrane. The resilient wall portion 304 is schematically shown in two different states, an open state as illustrated by a straight continuous line and a closed state as illustrated by a curved broken line.

The resilient wall portion 304 and the housing 302 are connected with the conduit 202 in a sealed manner such that a chamber 306 is formed between the resilient wall portion 304 and the housing 302. The chamber 306 is sealed and filled with a gas, e.g. nitrogen. The gas inside the chamber 306 acts as a spring against the resilient wall portion 304. A force applied on the resilient wall portion 304 due to the pressure of the refrigerant inside the refrigerant circuit 102 and the spring force applied to the resilient wall portion 304 due to the pressure of the gas inside the chamber 306 will be in equilibrium due to flexibility of the resilient wall portion 304. When a pressure changes on one side of the resilient wall portion 304, it will move into a new equilibrium position.

The gas inside the chamber 306 is enclosed in an elastic container 308. The elastic container 308 is schematically shown both with a continuous line and a broken line. The continuous line illustrates the elastic container 308 when the resilient wall portion 304 is in the open state and the broken line illustrates the elastic container 308 when the resilient wall portion 304 is in the closed state. The elastic container 308 may for instance be a rubber bladder. The purpose of the elastic container is to ensure that the gas does not leak out of the chamber 306.

Again, the volume of the chamber 306 decreases with increasing temperature and increasing pressure inside the refrigerant circuit 102 and the volume of the chamber 306 will increase with decreasing temperature and decreasing pressure inside the refrigerant circuit 102 as explained above.

Figure 4:
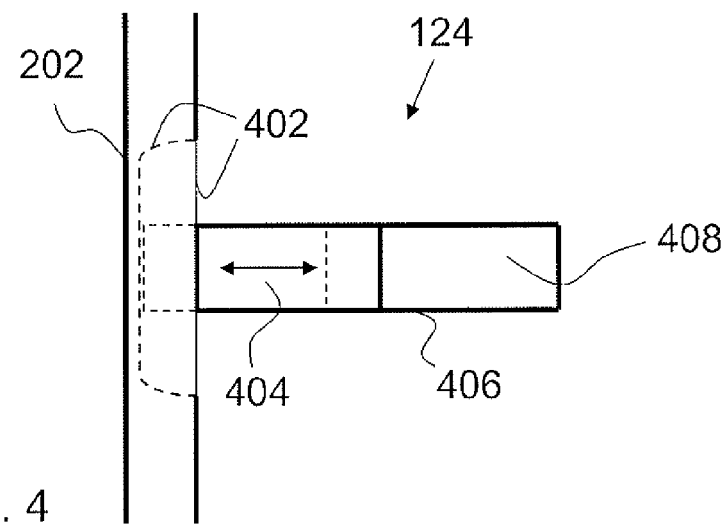

FIG. 4 illustrates schematically a section of a flow control device 124 of a heat transfer arrangement according to example embodiments. The flow control device 124 is arranged on a conduit 202 of the refrigerant circuit 102. The flow control device 124 comprises a movable member including a resilient wall portion 402 of the conduit 202 and a piston 404. The piston 404 is arranged in a piston housing 406. The movable member is shown in two different states, an open state as illustrated by the resilient wall portion 402 and the piston 404 drawn in straight continuous lines and a closed state as illustrated by the resilient wall portion 402 and the piston 404 drawn in curved broken lines. Again the piston 404 and the piston housing 406 form a chamber 408, which is filled with gas. The refrigerant is kept inside the conduit 202 by the resilient wall portion 402 and can not leak into the chamber 408.

The gas filled chamber 408 acts as a spring as explained above. When pressure increases inside the refrigerant circuit the resilient wall portion 402 is pressed against the piston 404, which in turn is moved further into the chamber 408 until the force from the refrigerant pressure and the spring force from the gas in the chamber 408 are equal. Conversely, if the pressure decreases inside the refrigerant circuit, the spring force from the gas in the chamber 408 presses the piston 404 against the resilient wall portion 402 such that it is moved into the conduit 202 reducing its through flow area.

Example embodiments may be combined as understood by a person skilled in the art. For instance, the elastic container 308 illustrated in FIG. 3 may be omitted and the chamber 306 may instead be directly filled with gas. Also the chambers 208, 408 illustrated in FIGS. 2 and 4 respectively, may be provided with elastic container enclosing the gas in the chambers 208, 408. It is also understood by those skilled in the art that the open state includes half open positions of the movable member, restricting flow of refrigerant inside the refrigerant circuit to a certain degree. Mentioned purely as an example, the movable member may for instance be in a closed state when a temperature inside the electronic component housing 112 is below +5 degrees Celsius, in an open state restricting flow at +15 degrees Celsius and in the open state without restricting flow at +40 degrees Celsius.

Even though the invention has been described with reference to example embodiments, many different alterations, modifications and the like will become apparent for those skilled in the art. The housing 302, the chamber 306 and the resilient wall portion 304 illustrated in FIG. 3 may for instance extend around the entire conduit 202. In FIG. 1 the flow control device 124 is illustrated to be arranged inside the electronic component housing 112. Thus, the flow control device 124 is subjected to the current temperature inside the electronic component housing 112. When the spring force is generated by an enclosed gas, the gas will in this case easily be able to adopt this temperature. It is however alternatively possible to arrange the flow control device outside the electronic component housing either in physical contact with the housing or not. This is possible since the refrigerant and the refrigerant pressure inside the refrigerant circuit is the same in the entire refrigerant circuit, inside and outside the electronic component housing. As mentioned above, this pressure is determined by the saturation pressure at a prevailing temperature inside the refrigerant circuit.

As used herein, the term "comprising" or "comprises" is open-ended, and includes one or more stated features, elements, steps, components or functions but does not preclude the presence or addition of one or more other features, elements, steps, components, functions or groups thereof.

As used herein, the term "and/or" includes any and all combinations of one or more of the associated listed items.

As used herein, the common abbreviation "e.g.", which derives from the Latin phrase "exempli gratia," may be used to introduce or specify a general example or examples of a previously mentioned item, and is not intended to be limiting of such item. If used herein, the common abbreviation "i.e.", which derives from the Latin phrase "id est," may be used to specify a particular item from a more general recitation.

The terminology used herein is for the purpose of describing particular embodiments only and is not intended to be limiting of the invention. As used herein, the singular forms "a", "an" and "the" are intended to include the plural forms as well, unless the context clearly indicates otherwise.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be understood that when an element is referred to as being "coupled" or "connected" to another element, it may be directly coupled or connected to the other element or intervening elements may also be present. In contrast, when an element is referred to as being "directly coupled" or "directly connected" to another element, there are no intervening elements present.

It is to be understood that the foregoing is illustrative of various example embodiments and is not to be limited to the specific embodiments disclosed and that modifications to the disclosed embodiments, combinations of features of disclosed embodiments as well as other embodiments are intended to be included within the scope of the appended claims.

The invention claimed is:

1. A heat transfer arrangement for heat exchange between an inside of an electronic component housing and an ambient environment, the heat transfer arrangement comprising:
    a refrigerant circuit, comprising an evaporator adapted to be arranged inside said electronic component housing, a condenser adapted to be arranged outside said electronic component housing, and conduits connecting said evaporator and said condenser, wherein a refrigerant is present in said refrigerant circuit and in use is arranged to self-circulate in a refrigerant flow in said refrigerant circuit by evaporating in said evaporator, rising as a gas through a first conduit of said conduits, condensing in said condenser and flowing through a second conduit of said conduits to said evaporator; and
    a flow control device comprising a movable member adapted to control said refrigerant flow, wherein said movable member affects a through flow area of one of said conduits, wherein said movable member is adapted to move in response to a pressure change inside said refrigerant circuit by being affected from a first side by a refrigerant pressure inside said refrigerant circuit and from a second side by a spring force such that said refrigerant flow is changed;
    wherein said spring force is generated by a gas enclosed in a chamber and wherein said chamber is in thermal communication with an inside of said electronic component housing.

2. The heat transfer arrangement of claim 1, wherein said movable member is arranged in or on one of said conduits.

3. The heat transfer arrangement of claim 1, wherein said movable member is arranged in or on said first conduit.

4. The heat transfer arrangement of claim 1, wherein said movable member is arranged in or on said second conduit.

5. The heat transfer arrangement of claim 1, wherein said movable member comprises a piston sliding in a piston housing.

6. The heat transfer arrangement of claim 1, wherein said chamber is formed by said piston and said piston housing.

7. The heat transfer arrangement of claim 1, wherein said movable member comprises a resilient wall portion of said conduits.

8. The heat transfer arrangement of claim 7, wherein said resilient wall portion forms a wall of said chamber.

9. The heat transfer arrangement of claim 1, wherein said gas is enclosed in an elastic container.

10. An electronic component housing comprising a heat transfer arrangement, the heat transfer arrangement comprising:
    a refrigerant circuit, comprising an evaporator adapted to be arranged inside said electronic component housing, a condenser adapted to be arranged outside said electronic component housing, and conduits connecting said evaporator and said condenser, wherein a refrigerant is present in said refrigerant circuit and in use is arranged to self-circulate in a refrigerant flow in said refrigerant circuit by evaporating in said evaporator, rising as a gas through a first conduit of said conduits, condensing in said condenser and flowing through a second conduit of said conduits to said evaporator; and
    a flow control device comprising a movable member adapted to control said refrigerant flow, wherein said movable member affects a through flow area of one of said conduits, wherein said movable member is adapted to move in response to a pressure change inside said refrigerant circuit by being affected from a first side by a refrigerant pressure inside said refrigerant circuit and from a second side by a spring force such that said refrigerant flow is changed;
    wherein said spring force is generated by a gas enclosed in a chamber and wherein said chamber is in thermal communication with an inside of the electronic component housing.

11. The electronic component housing of claim 10, further comprising a first gas moving device for circulating a gas inside said electronic component housing over an outer surface area of said evaporator.

12. The electronic component housing of claim 10, further comprising a second gas moving device for blowing ambient air over an outer surface area of said condenser.

13. The electronic component housing of claim 10, wherein said electronic component housing is part of a radio base station.

* * * * *

UNITED STATES PATENT AND TRADEMARK OFFICE
CERTIFICATE OF CORRECTION

PATENT NO. : 9,258,927 B2
APPLICATION NO. : 13/395896
DATED : February 9, 2016
INVENTOR(S) : Källmark et al.

Page 1 of 1

It is certified that error appears in the above-identified patent and that said Letters Patent is hereby corrected as shown below:

In the Specification

In Column 5, Line 19, delete "our" and insert -- or --, therefor.

Signed and Sealed this
Fourteenth Day of June, 2016

Michelle K. Lee
*Director of the United States Patent and Trademark Office*